(12) United States Patent
Lin et al.

(10) Patent No.: US 9,397,614 B2
(45) Date of Patent: Jul. 19, 2016

(54) MULTI-BAND POWER AMPLIFIER

(71) Applicant: QUALCOMM Incorporated, San Diego, CA (US)

(72) Inventors: Saihua Lin, Santa Clara, CA (US); Anup Savla, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 57 days.

(21) Appl. No.: 14/286,791

(22) Filed: May 23, 2014

(65) Prior Publication Data

US 2015/0340991 A1    Nov. 26, 2015

(51) Int. Cl.
| | |
|---|---|
| *H04B 1/04* | (2006.01) |
| *H03F 1/02* | (2006.01) |
| *H03F 3/191* | (2006.01) |
| *H03F 3/21* | (2006.01) |

(Continued)

(52) U.S. Cl.
CPC ............ *H03F 1/0205* (2013.01); *H03F 1/0277* (2013.01); *H03F 1/223* (2013.01); *H03F 3/191* (2013.01); *H03F 3/195* (2013.01); *H03F 3/211* (2013.01); *H03F 3/245* (2013.01); *H03F 3/45076* (2013.01); *H03F 3/45179* (2013.01); *H03F 3/68* (2013.01); *H04B 1/04* (2013.01); *H03F 2200/09* (2013.01); *H03F 2200/111* (2013.01); *H03F 2200/378* (2013.01); *H03F 2200/391* (2013.01); *H03F 2200/429* (2013.01); *H03F 2200/451* (2013.01); *H03F 2200/541* (2013.01); *H03F 2203/45181* (2013.01); *H03F 2203/45394* (2013.01); *H03F 2203/45554* (2013.01); *H03F 2203/45562* (2013.01); *H03F 2203/45631* (2013.01); *H03F 2203/45638* (2013.01); *H03F 2203/45704* (2013.01); *H03F 2203/45724* (2013.01); *H03F 2203/45726* (2013.01); *H03F 2203/45728* (2013.01); *H03F 2203/45731* (2013.01); *H03F 2203/7206* (2013.01); *H03F 2203/7209* (2013.01); *H03F 2203/7236* (2013.01); *H04B 2001/0408* (2013.01)

(58) Field of Classification Search
CPC ................... H03F 2200/111; H03F 2200/429; H04B 1/005; H04B 2001/0408
USPC ....................... 455/553.1, 127.1, 127.2, 127.4
See application file for complete search history.

(56) References Cited

U.S. PATENT DOCUMENTS

| | | | |
|---|---|---|---|
| 6,448,847 B1 * | 9/2002 | Paul | ...................... H03F 3/2171 327/563 |
| 7,023,272 B2 | 4/2006 | Hung et al. | |

(Continued)

FOREIGN PATENT DOCUMENTS

EP    1526572 A2    4/2005

OTHER PUBLICATIONS

Afsahi A., et al., "Linearized Dual-Band Power Amplifiers With Integrated Baluns in 65 nm CMOS for a 2 × 2 2 802.11n MIMO WLAN SoC," Journal of Solid-State Circuits, IEEE, vol. 45, No. 5, 2010, pp. 955-966.

(Continued)

*Primary Examiner* — Duc M Nguyen
(74) *Attorney, Agent, or Firm* — Toler Law Group, PC

(57) ABSTRACT

An apparatus includes a first capacitor, an inductor coupled to the first capacitor, and a second capacitor coupled to the inductor. The second capacitor is coupled to a first output of a differential amplifier.

18 Claims, 7 Drawing Sheets

(51) Int. Cl.
*H03F 3/68* (2006.01)
*H03F 3/45* (2006.01)
*H03F 1/22* (2006.01)
*H03F 3/195* (2006.01)
*H03F 3/24* (2006.01)

(56) References Cited

U.S. PATENT DOCUMENTS

| | | |
|---|---|---|
| 7,091,784 B1 | 8/2006 | Terrovitis |
| 7,092,691 B2 | 8/2006 | Bohn et al. |
| 7,271,674 B1* | 9/2007 | Butenhoff ............ H03G 3/3036 331/183 |
| 7,705,684 B2 | 4/2010 | Degani et al. |
| 8,626,084 B2 | 1/2014 | Chan et al. |
| 8,634,494 B2 | 1/2014 | Bai |
| 2002/0008585 A1* | 1/2002 | Welland .................... H03L 7/07 331/2 |
| 2002/0180534 A1* | 12/2002 | Bohn ...................... H03F 1/565 330/302 |
| 2002/0187768 A1* | 12/2002 | Lin ........................ H03H 11/32 455/318 |
| 2003/0067359 A1* | 4/2003 | Darabi ................... H03B 21/01 331/46 |
| 2004/0166804 A1* | 8/2004 | Moloudi ............ H03H 11/1291 455/20 |
| 2004/0219891 A1* | 11/2004 | Hadjichristos ........ H03F 1/0211 455/102 |
| 2006/0028301 A1* | 2/2006 | Kamata ................... H03F 3/191 333/174 |
| 2006/0093064 A1* | 5/2006 | Cui ........................ H03F 3/189 375/297 |
| 2008/0032661 A1 | 2/2008 | Ojo et al. |
| 2015/0194944 A1 | 7/2015 | Joshi et al. |

OTHER PUBLICATIONS

International Search Report and Written Opinion—PCT/US2015/028762—ISA/EPO—Jun. 26, 2015, 14 pages.
Pehlke D R: "An improved output network for a multi-band RF power amplifier," Research Disclosure, Mason Publications, Hampshire, GB, vol. 430, No. 72, Feb. 1, 2000, XP007125534, ISSN: 0374-4353 the whole document.
Zargari M., et al., "A Dual-Band CMOS MIMO Radio SoC for IEEE 802.11n Wireless LAN," IEEE Journal of Solid-State Circuits, Dec. 2008, vol. 43 (12), pp. 2882-2895.

* cited by examiner

MULTI-BAND POWER AMPLIFIER

I. FIELD

The present disclosure is generally related to a multi-band power amplifier.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless devices may include multiple power amplifiers and driver amplifiers to transmit signals over multiple frequency bands. For example, a first driver amplifier and a first power amplifier may be configurable to transmit signals over a first frequency band (e.g., a 2.4 Gigahertz (GHz) band). Additionally, a second driver amplifier and a second power amplifier may be configurable to transmit signals over a second frequency band (e.g., a 5.6 GHz band). Using multiple driver amplifiers and multiple power amplifiers for multi-band transmissions (e.g., dual-band transmissions) may increase die area. For example, a transistor core for each driver amplifier and a transistor core for each power amplifier may be relatively large (e.g., in the millimeter (mm) range), which may increase the chip size, die area, and cost of the driver amplifiers and power amplifiers.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
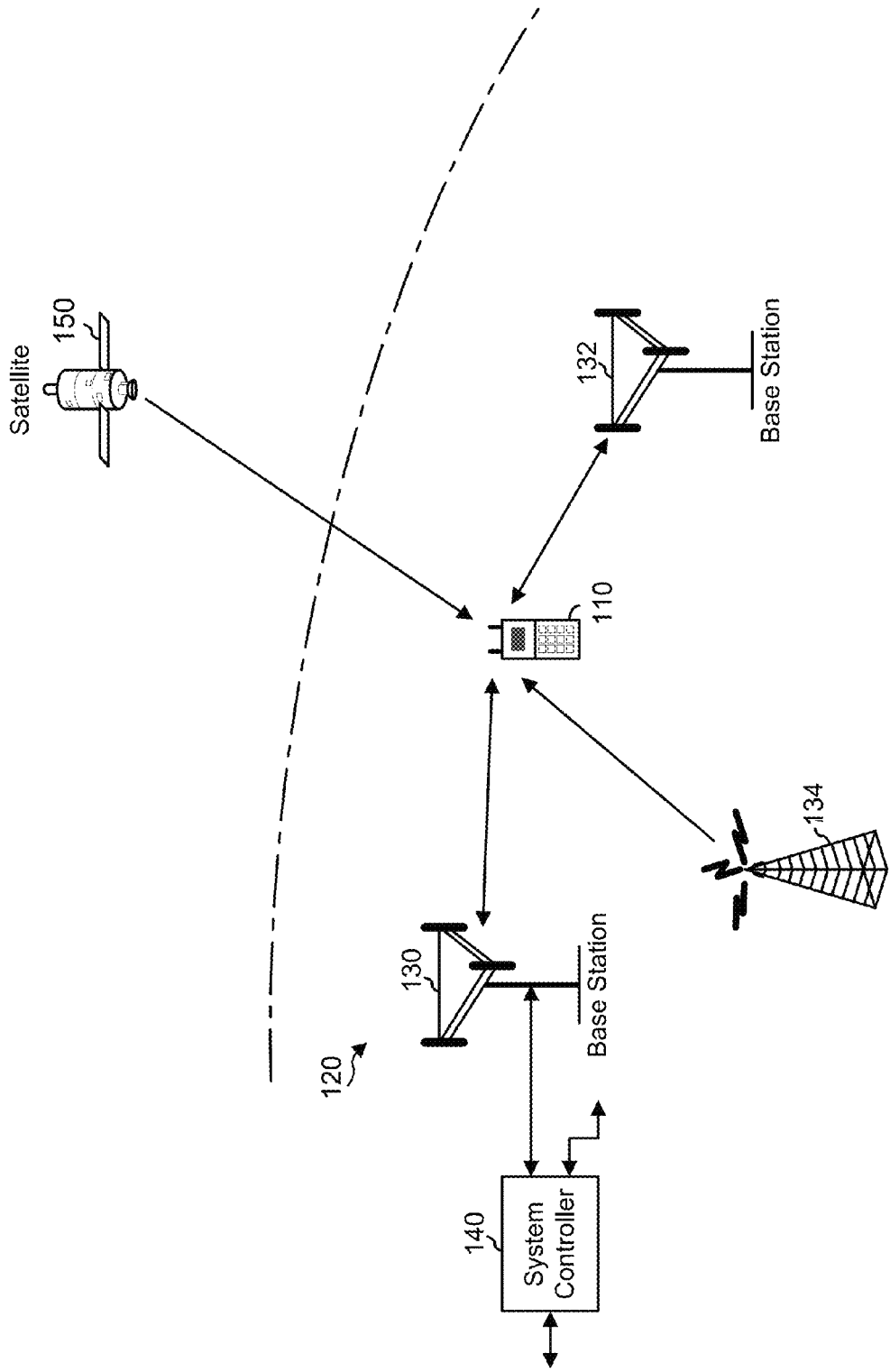
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
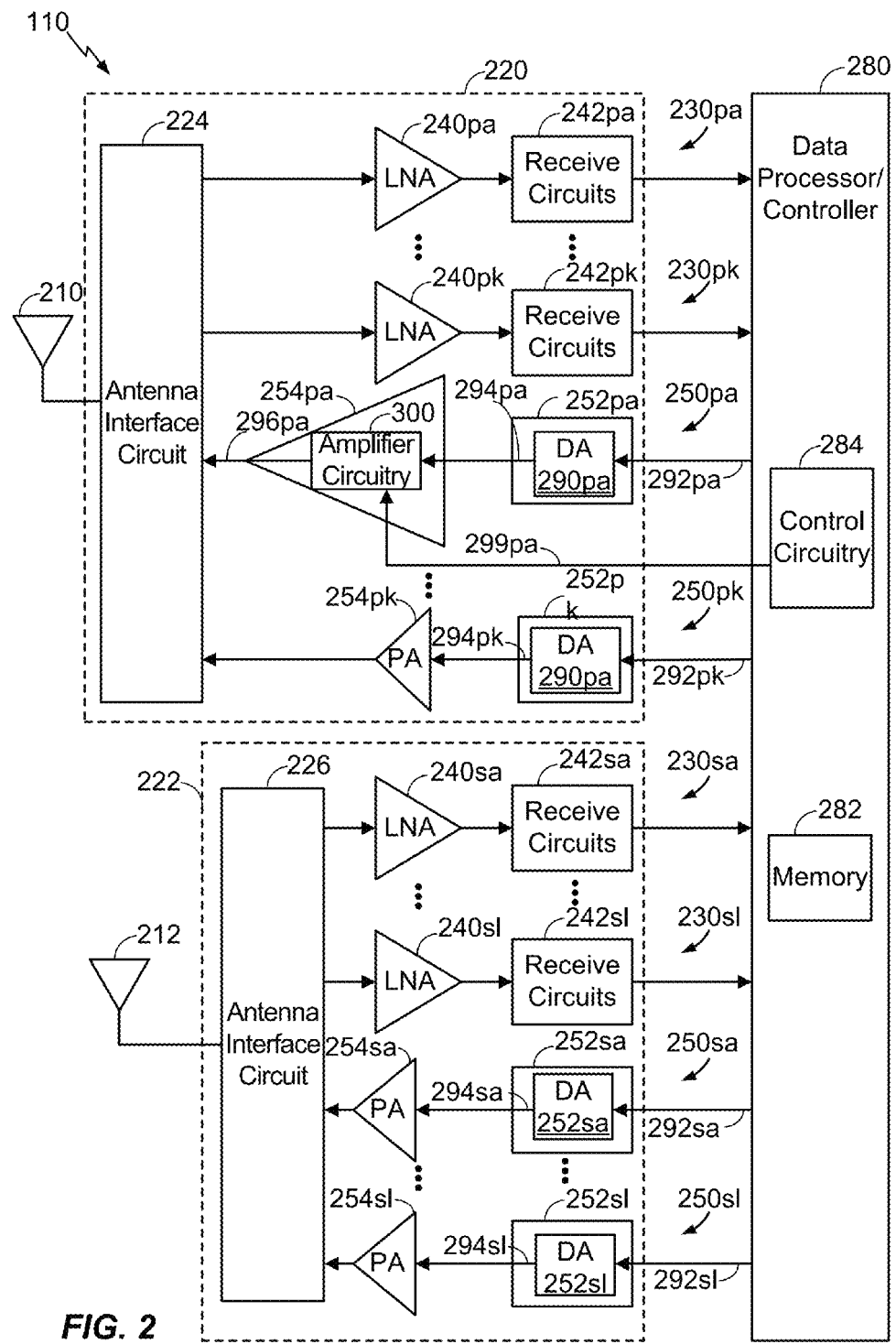
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receiver paths 230pa to 230pk and multiple (K) transmitter paths 250pa to 250pk to support multiple frequency bands, multiple radio technologies, carrier aggregation, etc. Transceiver 222 includes multiple (L) receiver paths 230sa to 230sl and multiple (L) transmitter paths 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver path 230pa, 230pk, 230sa, 230sl includes an LNA 240pa, 240pk, 240sa, 240sl and a receive circuit 242pa, 242pk, 242sa, 242sl, respectively. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver path 230*pa* is the selected receiver path. Within the receiver path 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242*pa* may include mixers, filters, amplifiers, matching circuits, an oscillator, a local oscillator (LO) generator, a phase locked loop (PLL), etc. Each remaining receiver paths 230*pk*, 230*sa*, 230*sl* in transceivers 220 and 222 may operate in a similar manner as receiver path 230*pa*.

In the exemplary design shown in FIG. 2, each transmitter path 250*pa*, 250*pk*, 250*sa*, 250*sl* includes a transmit circuit 252*pa*, 252*pk*, 252*sa*, 252*sl* and a power amplifier (PA) 254*pa*, 254*pk*, 254*sa*, 254*sl*, respectively. For data transmission, data processor 280 processes (e.g., encodes and modulates) data to be transmitted and provides an analog output signal to a selected transmitter. The description below assumes that transmitter path 250*pa* is the selected transmitter path. Within transmitter path 250*pa*, transmit circuits 252*pa* amplify, filter, and upconvert the analog output signal from baseband to RF and provide a modulated RF signal. Transmit circuits 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through antenna interface circuit 224 and transmitted via antenna 210. Each remaining transmitter path 250*pk*, 250*sa*, 250*sl* in transceivers 220 and 222 may operate in similar manner as transmitter 250*pa*.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

In an exemplary embodiment, the transmit circuits 252*pa*, 252*pk*, 252*sa*, 252*sl* may include driver amplifiers 290*pa*, 290*pk*, 290*sa*, 290*sl*, respectively. The driver amplifiers 290*pa*, 290*pk*, 290*sa*, 290*sl* may receive transmission signals (e.g., input signals) from the controller 280. One or more of the driver amplifiers 290*pa*, 290*pk*, 290*sa*, 290*sl* may be a multi-band driver amplifier having a single transistor core, such as the multi-band driver amplifier 500 as described in further detail with respect to FIG. 5 or the multi-band driver amplifier 600 as described in further detail with respect to FIG. 6. For example, one or more of the driver amplifiers 290*pa*, 290*pk*, 290*sa*, 290*sl* may receive a control signal from control circuitry 284 to selectively operate in a first frequency band, a second frequency band, or any combination thereof. The driver amplifiers 290*pa*, 290*pk*, 290*sa*, 290*sl* may provide amplified transmission signals 294*pa*, 294*pk*, 294*sa*, 294*sl* to the power amplifiers 254*pa*, 254*pk*, 254*sa*, 254*sl*, respectively.

In an exemplary embodiment, the power amplifiers 254*pa*, 254*pk*, 254*sa*, 254*sl* may receive output signals from the driver amplifiers 290*pa*, 290*pk*, 290*sa*, 290*sl*, respectively. One or more of the power amplifiers 254*pa*, 254*pk*, 254*sa*, 254*sl* may be a multi-band power amplifier. For example, one or more of the power amplifiers 254*pa*, 254*pk*, 254*sa*, 254*sl* may include dual-band power amplification circuitry having a single differential amplifier (e.g., a single transistor core), such as the dual-band power amplification circuitry 300 as described in further detail with respect to FIG. 3. In addition, or in the alternative, one or more of the power amplifiers 254*pa*, 254*pk*, 254*sa*, 254*sl* may include tri-band amplification circuitry having a differential amplifier (e.g., a single transistor core), such as the tri-band power amplifier 400 as described in further detail with respect to FIG. 4. In an exemplary embodiment, one or more of the power amplifiers 254*pa*, 254*pk*, 254*sa*, 254*sl* may receive a control signal (e.g., a control signal 299*pa*) from the control circuitry 284 to selectively operate in a first frequency band, a second frequency band, a third frequency band, or any combination thereof. As described in greater detail with respect to FIG. 3, the control signal 299*pa* may include a first enable signal (First_EN), a second enable signal (Second_EN), and/or a transmission enable signal (TX_EN). The amplification circuitry 300 may provide an amplified signal 296*pa* (e.g., an output signal of the power amplifier 254*pa*) to the antenna interface circuit 224.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. For example, the controller 280 may include control circuitry 284 to bias one or more of the power amplifiers 254*pa*, 254*pk*, 254*sa*, 254*sl* and/or one or more of the driver amplifiers 290*pa*, 290*pk*, 290*sa*, 290*sl* to operate in a first frequency band, a second frequency band, or any combination thereof. A memory 282 may store program code and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
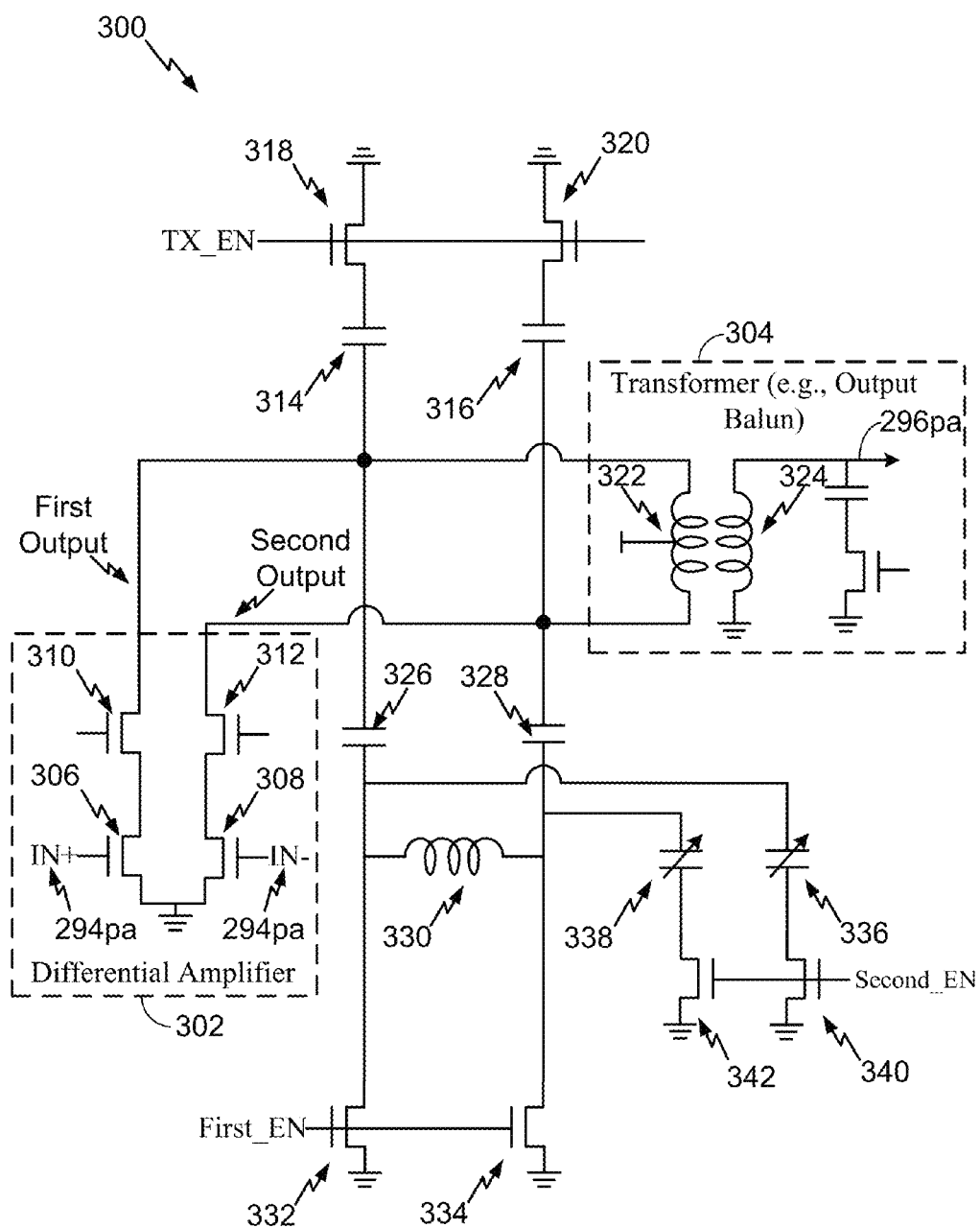
FIG. 3 is a diagram that depicts an exemplary embodiment of a dual-band power amplifier having a differential amplifier including a single transistor core.

Referring to FIG. 3, a diagram of a dual-band power amplifier 300 having a differential amplifier 302 including a single transistor core is shown. In an exemplary embodiment, the power amplifier 300 may correspond to, or be included in, one or more of the power amplifiers 254*pa*-254*pk*, 254*sa*-254*sl* of FIG. 2. The power amplifier 300 may receive control signals (e.g., a transmission enable signal (TX_EN), a first enable signal (First_EN), and a second enable signal (Second_EN)) from control circuitry (e.g., the control circuitry 284) to selectively operate in a first frequency band, in a second frequency band, or to concurrently operate in the first and second frequency bands. The controls signals may correspond to the control signal 299*pa* of FIG. 2. In an exemplary embodiment, the power amplifier 300 may be tunable in broadband frequency ranges. For example, the power amplifier 300 may be tuned to operate within a broad frequency spectrum (e.g., an extensive frequency range) having a communication bandwidth of at least 256 kilobits per second.

The power amplifier 300 may include a differential amplifier 302 (e.g., a transistor core) and a transformer 304 (e.g., an output balun). The differential amplifier 302 may include a transistor 306, a transistor 308, a transistor 310, and a transistor 312. In an exemplary embodiment, the transistors 306-312 of the differential amplifier 302 may be n-type metal oxide semiconductor (NMOS) transistors. The transistor 306 and the transistor 308 form a differential transistor pair. A source of the transistor 306 and a source of the transistor 308 may be coupled to ground. A gate of the transistor 306 and a gate of the transistor 308 may be coupled to receive a differential input signal (IN+, IN−). To illustrate, the gate of the transistor 306 and the gate of the transistor 308 may be coupled to receive the amplified transmission signals 294*pa* of FIG. 2 from the driver amplifier 290*pa*. A drain of the transistor 306 may be coupled to a source of the transistor 310, and a drain of the transistor 308 may be coupled to a source of the transistor 312.

The differential amplifier 302 may be coupled to the transformer 304. The transformer 304 may include an inductor 322 that is electromagnetically coupled to an inductor 324. A drain of the transistor 310 may be coupled to a first terminal of the inductor 322, and a drain of the transistor 312 may be coupled to a second terminal of the inductor 322. The transformer 304 may transfer energy from the inductor 322 (e.g., a primary winding) to the inductor 324 (e.g., a secondary winding) to generate an output of the power amplifier 300 at the inductor 324. For example, the output of the power amplifier 300 may correspond to the output signal 296*pa* that propagates through the inductor 324 based on the magnetic field and mutual induction between the primary and secondary windings. In an exemplary embodiment, the output of the power amplifier 300 may be provided to an antenna interface circuit (e.g., the antenna interface circuit 224 of FIG. 2 or the antenna interface circuit 226 of FIG. 2).

A first terminal of a capacitor 314 may be coupled to the drain of the transistor 310, and a second terminal of the capacitor 314 may be coupled to a drain of a transistor 318. In a similar manner, a first terminal of a capacitor 316 may be coupled to the drain of the transistor 312, and a second terminal of the capacitor 316 may be coupled to a drain of a transistor 320. In an exemplary embodiment, the transistors 318, 320 are NMOS transistors. A source of the transistor 318 and a source of the transistor 320 may be coupled to ground. A gate of the transistor 318 and a gate of the transistor 320 may be coupled to receive the transmission enable signal (TX_EN).

A first terminal of a capacitor 326 may be coupled to the drain of the transistor 310, and a second terminal of the capacitor 326 may be coupled to a first terminal of an inductor 330. A first terminal of a capacitor 328 may be coupled to the drain of the transistor 312, and a second terminal of the capacitor 328 may be coupled to a second terminal of the inductor 330. The first terminal of the inductor 330 may be coupled to a drain of a transistor 332, and the second terminal of the inductor 330 may be coupled to a drain of a transistor 334. In an exemplary embodiment, the transistors 332, 334 are NMOS transistors. A source of the transistor 332 and a source of the transistor 334 are coupled to ground. A gate of the transistor 332 and a gate of the transistor 334 may be coupled to receive the first enable signal (First_EN).

A first terminal of a capacitor 336 may be coupled to the first terminal of the inductor 330, and a first terminal of a capacitor 338 may be coupled to the second terminal of the inductor 330. A second terminal of the capacitor 336 may be coupled to a drain of a transistor 340, and a second terminal of the capacitor 338 may be coupled to a drain of a transistor 342. In an exemplary embodiment, each capacitor 336, 338 represents a tunable capacitor bank. For example, each capacitor 336, 338 may represent multiple capacitor branches coupled in parallel. Each capacitor branch may include a switch (e.g., a transistor) coupled in series with a capacitor. To increase the capacitance of the tunable capacitor banks 336, 338, a control signal (from the control circuitry 284 of FIG. 2) may activate a switch to "turn on" a corresponding capacitor branch. In another exemplary embodiment, the capacitors 336, 338 may be single capacitors.

In an exemplary embodiment, the transistors 340, 342 are NMOS transistors. A source of the transistor 340 and a source of the transistor 342 are coupled to ground. A gate of the transistor 340 and a gate of the transistor 342 may be coupled to receive the second enable signal (Second_EN).

During operation, a first differential input signal (IN+) may be provided to the transistor 306 such that the first differential input signal (IN+) propagates along a first path when the transistor 310 is enabled, and a second differential input signal (IN−) may be provided to the transistor 308 such that the second differential input signal (IN−) propagates along a second path when the transistor 312 is enabled. The first path includes the capacitor 314, the inductor 322, the capacitor 326, the inductor 330, and the capacitor 336. The second path includes the capacitor 316, the inductor 322, the capacitor 328, the inductor 330, and the capacitor 338.

To operate in a first frequency band (e.g., a 2.4 GHz frequency band), the transmission enable signal (TX_EN) may activate the transistor 318 (e.g., a shunt-to ground transistor) and the first enable signal (First_EN) may activate the transistor 334 (e.g., a shunt-to-ground transistor). For example, the transmission enable signal (TX_EN) may be at a logical high voltage level and enable conduction of the transistor 318. Additionally, the first enable signal (First_EN) may be at a logical high voltage level and enable conduction of the transistor 334. Thus, the capacitor 314 may be shunt to ground and additional current may charge the capacitor 326 and additional current may propagate through the inductor 330 (e.g., the inductor 330 may be coupled to ground via the transistor 334). Current based on the first differential input signal (IN+) may charge the capacitor 314, charge the capacitor 326, flow through the inductor 322, and flow through the inductor 330 such that the output of the differential amplifier 302 is subject to a relatively high capacitance (e.g., the capacitance of the capacitor 314 and the capacitance of the capacitor 326). Subjecting the output to the differential amplifier 302 to the relatively high capacitance may cause the power amplifier 300 to operate within the first frequency band.

In a similar manner, the transmission enable signal (TX_EN) may activate the transistor 320 (e.g., a shunt-to-ground transistor) and the first enable signal (First_EN) may activate the transistor 332 (e.g., a shunt-to-ground transistor). Thus, the capacitor 316 may be shunt to ground and additional current may charge the capacitor 328 and additional current may propagate through the inductor 330 (e.g., the inductor may be coupled to ground via the transistor 332). Current based on the second differential input signal (IN−) may charge the capacitor 316, charge the capacitor 328, flow through the inductor 322, and flow through the inductor 330 such that the output of the differential amplifier 302 is subject to a relatively high capacitance (e.g., the capacitance of the capacitor 316 and the capacitance of the capacitor 328). Subjecting the output of the differential amplifier 302 to the relatively high capacitance may cause the power amplifier 300 to operate within the first frequency band.

To operate in a second frequency band (e.g., a 5.6 GHz frequency band), the transmission enable signal (TX_EN) may activate the transistor 318 and the capacitor 314 may be shunt to ground. In addition, the first enable signal (First_EN) may disable the transistor 334 to decouple the inductor 330 from ground such that the capacitor 326 is a "floating" capacitor. For example, the first enable signal (First_EN) may have a logical low voltage level and may disable (e.g., turn off) conduction of the transistor 334. Thus, current based on the first differential input signal (IN+) may charge the capacitor 314 and flow through the inductor 322 such that the output of the differential amplifier 302 is subject to a reduced capacitance (e.g., a capacitance based on the capacitor 314 as opposed to a capacitance based on the capacitor 314 and the capacitor 326). Subjecting the output of the differential amplifier 302 to the reduced capacitance may cause the power amplifier 300 to operate within the second frequency band.

In a similar manner, the transmission enable signal (TX_EN) may activate the transistor 320 and the capacitor 316 may be shunt to ground. In addition, the first enable signal (First_EN) may disable the transistor 332 to decouple the inductor 330 from ground such that the capacitor 328 is a "floating" capacitor. Current based on the second differential input signal (IN−) may charge the capacitor 316 and flow through the inductor 322 such that the output of the differential amplifier 302 is subject to a reduced capacitance (e.g., a capacitance based on the capacitor 316 as opposed to a capacitance based on the capacitor 316 and the capacitor 328). Subjecting the output of the differential amplifier 302 to the reduced capacitance may cause the power amplifier 300 to operate within the second frequency band.

In an exemplary embodiment, the power amplifier 300 may concurrently operate in the first frequency band and the second frequency band. For example, the second enable signal (Second_EN) may enable the transistors 340, 342 such that the output of the differential amplifier 302 is additionally subject to the capacitance of the capacitors 336, 338. The increased capacitance may cause the cause the power amplifier 300 to operate within the first frequency band (e.g., the 2.4 GHz frequency band) in addition to operating within the second frequency band. For example, the increased capacitance may cause the inductive and capacitive elements coupled to the output of the differential amplifier 302 to resonate at approximately 2.4 GHz and at approximately 5.6 GHz.

The power amplifier 300 of FIG. 3 may reduce die area and increase cost savings by utilizing a single differential amplifier 302 (as opposed to multiple transistor cores) to operate within one or more frequency bands (e.g., transmit over one or more frequency bands). One capacitor-inductor-capacitor (CLC) network may be coupled to the primary coil (e.g., the inductor 322) of the transformer 304 (e.g., the output balun). For example, the CLC network (e.g., the capacitor 326, the inductor 330, and the capacitor 328) may be coupled to the inductor 322 and configured to operate within the first frequency band. In addition, the CLC network may be decoupled from the inductor 322 to configure the power amplifier 300 to operate within the second frequency band. It will also be appreciated that operating the power amplifier 300 within the first frequency band (e.g., 2.4 GHz) and/or the second frequency band (e.g., 5.6 GHz) may facilitate communication based on a wireless communications standard, such as an Institute of Electrical and Electronics Engineers (IEEE) 802.11 standard. For example, the power amplifier 300 may facilitate communication based on an IEEE 802.11a protocol, an IEEE 802.11b protocol, an 802.11g protocol, an IEEE 802.11n protocol, and/or an IEEE 802.11 ac protocol.

Figure 4:
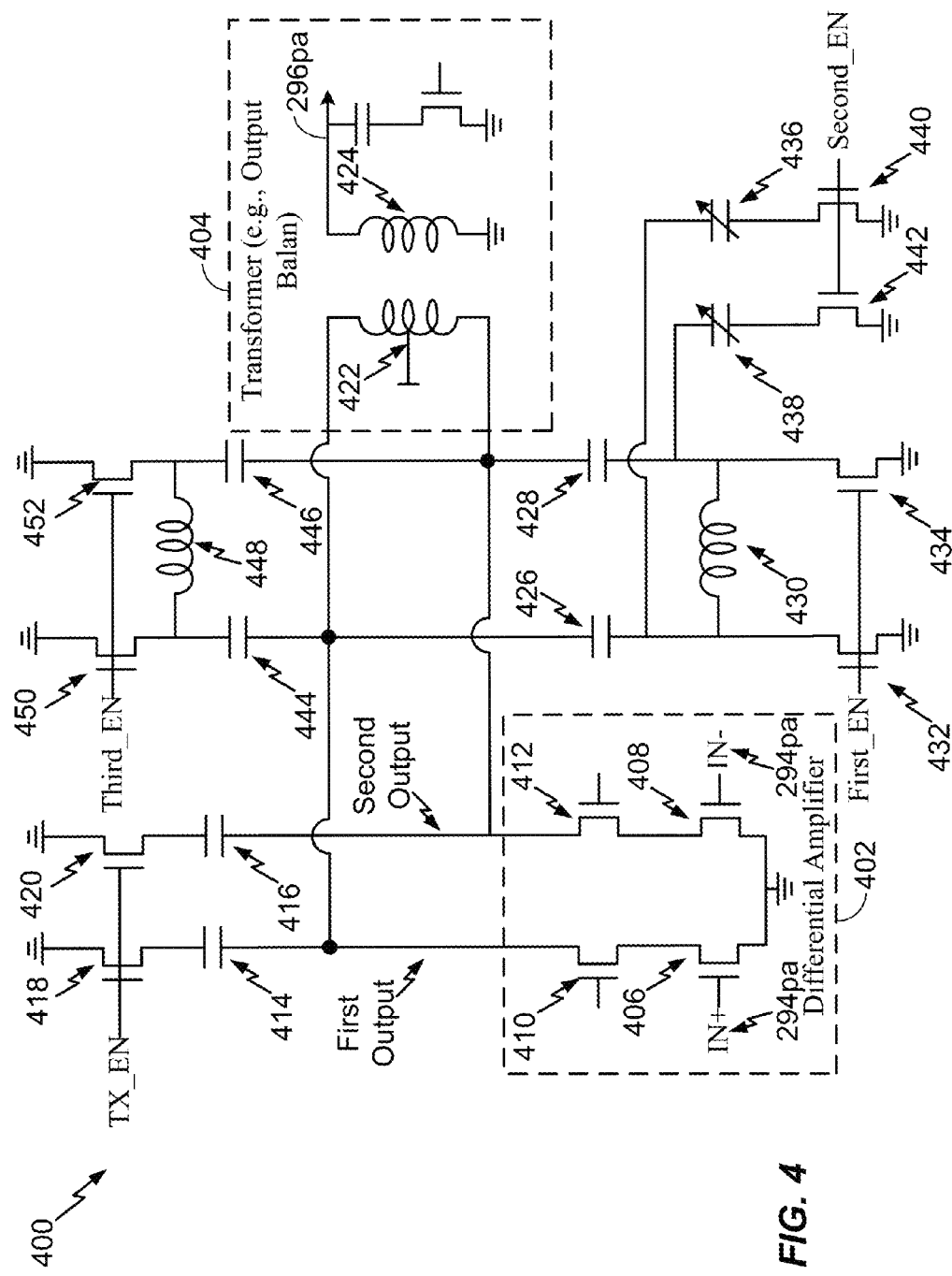
FIG. 4 is a diagram that depicts an exemplary embodiment of a tri-band power amplifier having a differential amplifier including a single transistor core.

Referring to FIG. 4, a diagram of a tri-band power amplifier 400 having a differential amplifier 402 including a single transistor core is shown. In an exemplary embodiment, the power amplifier 400 may correspond to, or may be included in, one or more of the power amplifiers 254pa-254pk, 254sa-254sl of FIG. 2. The power amplifier 400 may receive control signals (e.g., a transmission enable signal (TX_EN), a first enable signal (First_EN), a second enable signal (Second_EN), and a third enable signal (Third_EN)) from control circuitry (e.g., the control circuitry 284) to selectively operate in a first frequency band, in a second frequency band, or in a third frequency band. In an exemplary embodiment, the power amplifier 400 may be tunable in broadband frequency ranges. For example, the power amplifier 400 may be tuned to operate within a broad frequency spectrum (e.g., an extensive frequency range) having a communication bandwidth of at least 256 kilobits per second.

The power amplifier 400 may include a differential amplifier 402 (e.g., a transistor core) and a transformer 404 (e.g., an output balun). The differential amplifier 402 may include a transistor 406, a transistor 408, a transistor 410, and a transistor 412. In an exemplary embodiment, the transistors 406-412 of the differential amplifier 402 may be NMOS transistors. The transistor 406 and the transistor 408 form a differential transistor pair. A source of the transistor 406 and a source of the transistor 408 may be coupled to ground. A gate of the transistor 406 and a gate of the transistor 408 may be coupled to receive a differential input signal (IN+, IN−). To illustrate, the gate of the transistor 406 and the gate of the transistor 408 may be coupled to receive one of the amplified transmission signals 294pa, 294pk, 294sa, 294sl of FIG. 2 from a corresponding driver amplifier 290pa, 290pk, 290sa, 290sl. A drain of the transistor 406 may be coupled to a source of the transistor 410, and a drain of the transistor 408 may be coupled to a source of the transistor 412.

The differential amplifier 402 may be coupled to the transformer 404. The transformer 404 may include an inductor 422 that is electromagnetically coupled to an inductor 424. A drain of the transistor 410 may be coupled to a first terminal of the inductor 422, and a drain of the transistor 412 may be coupled to a second terminal of the inductor 422. The transformer 404 may transfer energy from the inductor 422 (e.g., a primary winding) to the inductor 424 (e.g., a secondary winding) to generate an output of the power amplifier 400 at the inductor 424. For example, the output of the power amplifier 400 may be the output signal 296pa that propagates through the inductor 424 based on the magnetic field and mutual induction between the primary and secondary windings. In an exemplary embodiment, the output of the power amplifier 400 may be provided to an antenna interface circuit (e.g., the antenna interface circuit 224 of FIG. 2 or the antenna interface circuit 226 of FIG. 2).

A first terminal of a capacitor 414 may be coupled to the drain of the transistor 410, and a second terminal of the capacitor 414 may be coupled to a drain of a transistor 418. In a similar manner, a first terminal of a capacitor 416 may be coupled to the drain of the transistor 412, and a second terminal of the capacitor 416 may be coupled to a drain of a transistor 420. In an exemplary embodiment, the transistors 418, 420 are NMOS transistors. A source of the transistor 418 and a source of the transistor 420 may be coupled to ground. A gate of the transistor 418 and a gate of the transistor 420 may be coupled to receive the transmission enable signal (TX_EN).

A first terminal of a capacitor 426 may be coupled to the drain of the transistor 410, and a second terminal of the capacitor 426 may be coupled to a first terminal of an inductor 430. A first terminal of a capacitor 428 may be coupled to the drain of the transistor 412, and a second terminal of the capacitor 428 may be coupled to a second terminal of the inductor 430. The first terminal of the inductor 430 may be coupled to a drain of a transistor 432, and the second terminal of the inductor 430 may be coupled to a drain of a transistor 434. In an exemplary embodiment, the transistors 432, 434 are NMOS transistors. A source of the transistor 432 and a source of the transistor 434 are coupled to ground. A gate of the transistor 432 and a gate of the transistor 434 may be coupled to receive the first enable signal (First_EN).

A first terminal of a capacitor 436 may be coupled to the first terminal of the inductor 430, and a first terminal of a capacitor 438 may be coupled to the second terminal of the inductor 430. A second terminal of the capacitor 436 may be coupled to a drain of a transistor 440, and a second terminal of the capacitor 438 may be coupled to a drain of a transistor 442. In an exemplary embodiment, each capacitor 436, 438 may represent a tunable capacitor bank. For example, each capacitor 436, 438 may include multiple capacitor branches coupled in parallel. Each capacitor branch may include a switch (e.g., a transistor) coupled in series with a capacitor. To increase the capacitance of the capacitors 436, 438, a control signal (from the control circuitry 284 of FIG. 2) may activate a switch to "turn on" a corresponding capacitor branch. In another exemplary embodiment, the capacitors 436, 438 may be single capacitors.

In an exemplary embodiment, the transistors 440, 442 are NMOS transistors. A source of the transistor 440 and a source of the transistor 442 are coupled to ground. A gate of the transistor 440 and a gate of the transistor 442 may be coupled to receive the second enable signal (Second_EN).

A first terminal of a capacitor 444 may be coupled to the drain of the transistor 410, and a second terminal of the capacitor 444 may be coupled to a first terminal of an inductor 448. A first terminal of a capacitor 446 may be coupled to the drain of the transistor 412, and a second terminal of the capacitor 446 may be coupled to a second terminal of the inductor 448. The first terminal of the inductor 448 may be coupled to a drain of a transistor 450, and the second terminal of the inductor 448 may be coupled to a drain of a transistor 452. In an exemplary embodiment, the transistors 450, 452 are NMOS transistors. A source of the transistor 450 and a source of the transistor 452 are coupled to ground. A gate of the transistor 450 and a gate of the transistor 452 may be coupled to receive the third enable signal (Third_EN).

During operation, a first differential input signal (IN+) may be provided to the transistor 406 such that the first differential input signal (IN+) propagates along a first path when the transistor 410 is enabled, and a second differential input signal (IN−) may be provided to the transistor 408 such that the second differential input signal (IN−) propagates along a second path when the transistor 412 is enabled. The first path includes the capacitor 414, the inductor 422, the capacitor 426, the inductor 430, the capacitor 436, the capacitor 444, and the inductor 448. The second path includes the capacitor 416, the inductor 422, the capacitor 428, the inductor 430, the capacitor 438, the capacitor 446, and the inductor 448.

To operate in a first frequency band (e.g., a 2.4 GHz frequency band), the transmission enable signal (TX_EN) may activate the transistor 418 (e.g., a shunt-to ground transistor), the first enable signal (First_EN) may activate the transistor 434 (e.g., a shunt-to-ground transistor), and the third enable signal (Third_EN) may deactivate the transistor 452 (e.g., a shunt-to-ground transistor). For example, the transmission enable signal (TX_EN) may be at a logical high voltage level and enable conduction of the transistor 418, the first enable signal (First_EN) may be at a logical high voltage level and enable conduction of the transistor 434, and the third enable signal (Third_EN) may be a logical low voltage level to disable conduction of the transistor 452. Thus, the capacitor 414 may be shunt to ground, additional current may charge the capacitor 426 and additional current may propagate through the inductor 430 (e.g., the inductor 430 may be coupled to ground via the transistor 434), and the capacitor 444 may be decoupled from ground to operate as a "floating" capacitor. Current based on the first differential input signal (IN+) may charge the capacitor 414, charge the capacitor 426, flow through the inductor 422, and flow through the inductor 430 such that the output of the differential amplifier 402 is subject to a relatively high capacitance (e.g., the capacitance of the capacitor 414 and the capacitance of the capacitor 426). Subjecting the output to the differential amplifier 402 to the relatively high capacitance may cause the power amplifier 400 to operate within the first frequency band.

In a similar manner, the transmission enable signal (TX_EN) may activate the transistor 420 (e.g., a shunt-to-ground transistor), the first enable signal (First_EN) may activate the transistor 432 (e.g., a shunt-to-ground transistor), and the third enable signal (Third_EN) may deactivate the transistor 450. Thus the capacitor 416 may be shunt to ground, additional current may charge the capacitor 428 and additional current may propagate through the inductor 430 (e.g., the inductor 430 may be coupled to ground via the transistor 432), and the capacitor 446 may be decoupled from ground to operate as a "floating" capacitor. Current based on the second differential input signal (IN−) may charge the capacitor 416, charge the capacitor 428, flow through the inductor 422, and flow through the inductor 430 such that the output of the differential amplifier 402 is subject to a relatively high capacitance (e.g., the capacitance of the capacitor 416 and the capacitance of the capacitor 428). Subjecting the output of the differential amplifier 402 to the relatively high capacitance may cause the power amplifier 400 to operate within the first frequency band.

To operate in a second frequency band (e.g., a 5.6 GHz frequency band), the transmission enable signal (TX_EN) may activate the transistor 418 and the capacitor 414 may be shunt to ground. In addition, the first enable signal (First_EN) may disable the transistor 434 to decouple the inductor 430 from ground such that the capacitor 426 is a "floating" capacitor, and the third enable signal (Third_EN) may disable the transistor 452 to decouple the inductor 448 from ground such that the capacitor 444 is a "floating" capacitor. Current based on the first differential input signal (IN+) may charge the capacitor 414 and flow through the inductor 422 such that the output of the differential amplifier 402 is subject to reduced capacitance (e.g., a capacitance based on the capacitor 414 as opposed to a capacitance based on the capacitor 414 and the capacitor 426). Subjecting the output of the differential amplifier 402 to the reduced capacitance may cause the power amplifier 400 to operate within the second frequency band.

In a similar manner, the transmission enable signal (TX_EN) may activate the transistor 420 and the capacitor 416 may be shunt to ground. In addition, the first enable signal (First_EN) may disable the transistor 432 to decouple the inductor 430 from ground such that the capacitor 428 is a "floating" capacitor, and the third enable signal (Third_EN) may disable the transistor 450 to decouple the inductor 448 from ground such that the capacitor 446 is a "floating" capacitor. Current based on the second differential input signal (IN−) may charge the capacitor 416 and flow through the inductor 422 such that the output of the differential amplifier 402 is subject to a reduced capacitance (e.g., a capacitance based on the capacitor 416 as opposed to a capacitance based on the capacitor 416 and the capacitor 428). Subjecting the output of the differential amplifier 402 to the reduced capacitance may cause the power amplifier 400 to operate within the second frequency band.

In an exemplary embodiment, the power amplifier 400 may concurrently operate in the first frequency band and the second frequency band. For example, the second enable signal (Second_EN) may enable the transistors 440, 442 such that the output of the differential amplifier 302 is additionally subject to the capacitance of the capacitors 436, 438. The increased capacitance may cause the cause the power amplifier to operate within the first frequency band (e.g., the 2.4 GHz frequency band) in addition to operating within the second frequency band. For example, the increased capacitance may cause the inductive and capacitive elements coupled to the output of the differential amplifier 302 to resonate at approximately 2.4 GHz and at approximately 5.6 GHz.

To operate in a third frequency band (e.g., an 800 megahertz (MHz) frequency band), the transmission enable signal (TX_EN) may activate the transistor 418, the first enable signal (First_EN) may deactivate the transistor 434, and the third enable signal (Third_EN) may activate the transistor 452. The capacitor 414 may be shunt to ground, the capacitor 426 may operate as a "floating" capacitor, and additional current may charge the capacitor 444 and additional current may propagate through the inductor 448 (e.g., the inductor 448 may be coupled to ground via the transistor 452). In an exemplary embodiment, the capacitance of the capacitor 444 may be greater than the capacitance of the capacitor 426 such that the differential amplifier 402 is subject to a greater capacitance when the capacitor 444 is "active" than when the capacitor 426 is "active" (e.g., the first frequency band). As a non-limiting example, the capacitor 444 may be a 5 pico-Farad (pF) capacitor and the capacitor 426 may be a 2.5 pF capacitor. Subjecting the output of the differential amplifier 402 to the increased capacitance may cause the power amplifier 400 to operate within the third frequency band.

In a similar manner, the transmission enable signal (TX_EN) may activate the transistor 420, the first enable signal (First_EN) may deactivate the transistor 432, and the third enable signal (Third_EN) may activate the transistor 450. The capacitor 416 may be shunt to ground, the capacitor 428 may operate as a "floating" capacitor, and additional current may charge the capacitor 446 and additional current may propagate through the inductor 448 (e.g., the inductor 448 may be coupled to ground via the transistor 450). In an exemplary embodiment, the capacitance of the capacitor 446 may be greater than the capacitance of the capacitor 428 such that the differential amplifier 402 is subject to a greater capacitance when the capacitor 446 is "active" than when the capacitor 428 is "active" (e.g., the first frequency band). Subjecting the output of the differential amplifier 402 to the increased capacitance may cause the power amplifier 400 to operate within the third frequency band.

The power amplifier 400 of FIG. 4 may reduce die area and increase cost savings by utilizing a single differential amplifier 402 (as opposed to multiple transistor cores) to operate within one or more frequency bands. Two CLC networks may be coupled to the primary coil (e.g., the inductor 422) of the output balun. For example, a first CLC network (e.g., the capacitor 426, the inductor 430, and the capacitor 428) may be coupled to the inductor 422, and a second CLC network (e.g., the capacitor 444, the inductor 448, and the capacitor 446) may be coupled to the inductor 422. It will also be appreciated that operating the power amplifier 400 at the third frequency band (e.g., 800 MHz) may facilitate communication based on an IEEE 802.11ah protocol.

Figure 5:
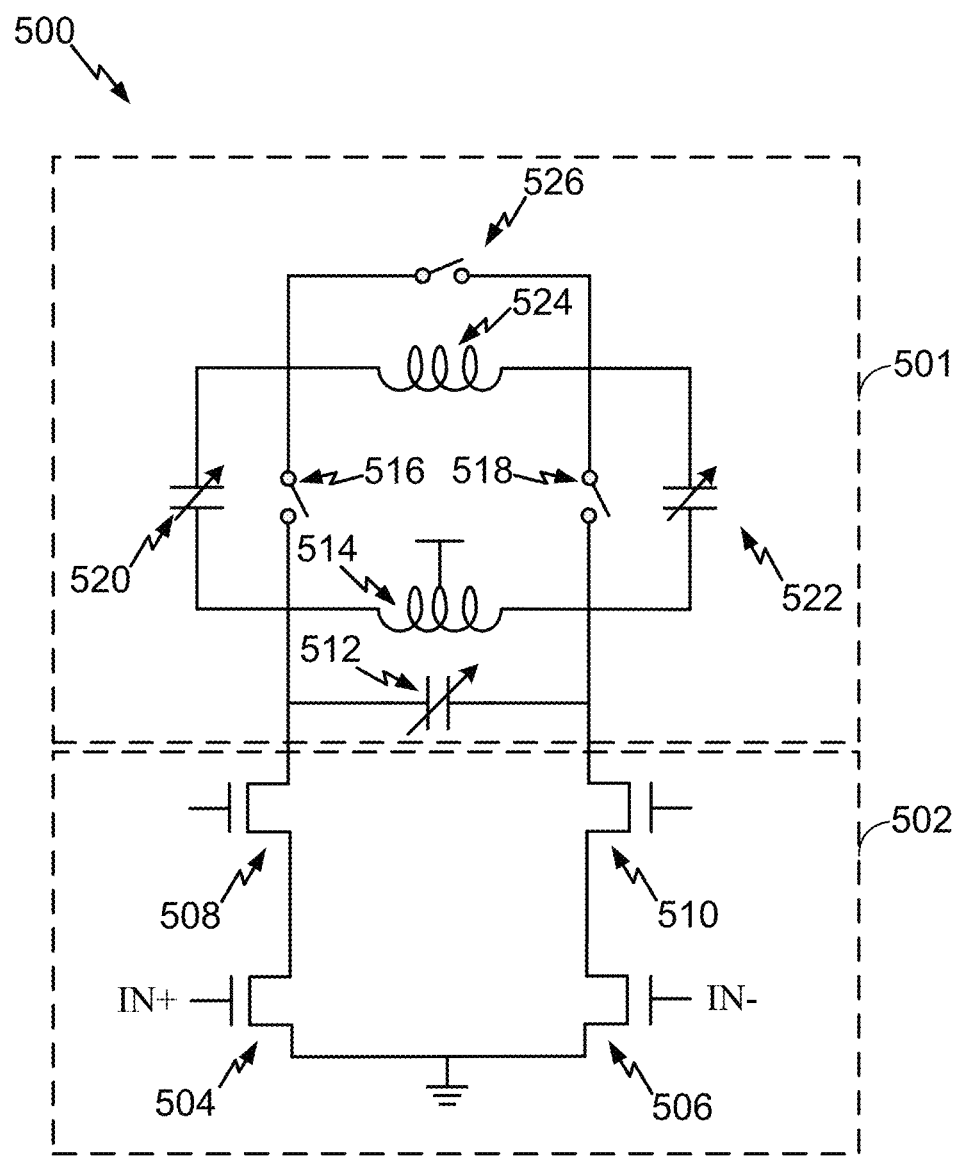
FIG. 5 is a diagram the depicts an exemplary embodiment of a multi-band driver amplifier having a differential amplifier including a single transistor core.

Referring to FIG. 5, an exemplary embodiment of a multi-band driver amplifier 500 having a differential amplifier 502 including a single transistor core is shown. In an exemplary embodiment, the driver amplifier 500 may correspond to, or may be included in, one or more of the driver amplifiers 290pa, 290pk, 290sa, 290sl of FIG. 2. The driver amplifier 500 may receive control signals from control circuitry (e.g., the control circuitry 284) to selectively operate in a first frequency band, a second frequency band, or any combination thereof.

The driver amplifier 500 includes an inductor-capacitor (LC) tank 501 and a differential amplifier 502 (e.g., a transistor core). The differential amplifier 502 may include a transistor 504, a transistor 506, a transistor 508, and a transistor 510. In an exemplary embodiment, the transistors 504-510 of the differential amplifier 502 may be NMOS transistors. A source of the transistor 504 and a source of the transistor 506 may be coupled to ground. A gate of the transistor 504 and a gate of the transistor 506 may be coupled to receive a differential input signal (IN+, IN). To illustrate, the gate of the transistor 504 and the gate of the transistor 506 may be coupled to receive a transmission signal from the data processor/controller 280 of FIG. 2. A drain of the transistor 504 may be coupled to a source of the transistor 508, and a drain of the transistor 506 may be coupled to a source of the transistor 510.

A drain of the transistor 508 may be coupled to a first terminal of a tunable capacitor bank 512, and a drain of the transistor 510 may be coupled to a second terminal of the tunable capacitor bank 512. The tunable capacitor bank 512 may be coupled in parallel with an inductor 514. For example, the first terminal of the tunable capacitor bank 512 may be coupled to a first terminal of the inductor 514, and the second terminal of the tunable capacitor bank 512 may be coupled to a second terminal of the inductor 514.

Components of the LC tank 501 (e.g., CLC network components) may be selectively coupled to the output of the differential amplifier 502 such that the driver amplifier 500 may operate in a single frequency band or simultaneously operate in multiple frequency bands. For example, the CLC network components include a capacitor 520, a capacitor 522, and an inductor 524. In an exemplary embodiment, the capacitor 520 and the capacitor 522 may be tunable capacitors (e.g., tunable capacitor banks). A first terminal of the capacitor 520 may be coupled to the first terminal of the inductor 514, and a second terminal of the capacitor 520 may be coupled to a first terminal of the inductor 524. A first terminal of the capacitor 522 may be coupled to the second terminal of the inductor 514, and a second terminal of the capacitor 522 may be coupled to a second terminal of the inductor 524. A switch 516 may be coupled in parallel with (e.g., across from) the capacitor 520, a switch 518 may be coupled in parallel with (e.g., across from) the capacitor 522, and a switch 526 may be coupled in parallel with (e.g., across from) the inductor 524.

During operation, the driver amplifier 500 may operate within a first frequency band (e.g., a 2 GHz frequency band), operate a second frequency band (e.g., a 5 GHz frequency band), or simultaneously operate in the first frequency band and the second frequency band. To operate in the first frequency band, control signals (from the control circuitry 284) may be provided to close the switch 526, open the switch 516, and open the switch 518. Thus, when operating in the first frequency band, current may charge the capacitors 520, 522 and current may be shorted across the switch 526 as opposed to propagating through the inductor 524.

To operate in the second frequency band, control signals may be provided to close the switch 516, close the switch 518, and open the switch 526. Thus, when operating in the second frequency band, current may be shorted across the switches 516, 518 as opposed to charging the capacitors 520, 522, respectively, and current may propagate through the inductor 524. To simultaneously operate in the first and second frequency bands, control signals may be provided to open each switch 516, 518, 526. Thus, when simultaneously operating in first and second frequency bands, current may charge the capacitors 520, 522 and propagate through the inductor 524.

The driver amplifier 500 of FIG. 5 may reduce die area and increase cost savings by utilizing a single differential amplifier 502 (as opposed to multiple transistor cores) to operate within one or more frequency bands. It will also be appreciated that operating the driver amplifier 500 within the first frequency band, the second frequency band, or a combination thereof, may facilitate communication based on wireless communications standards, as described with respect to FIG. 3.

Figure 6:
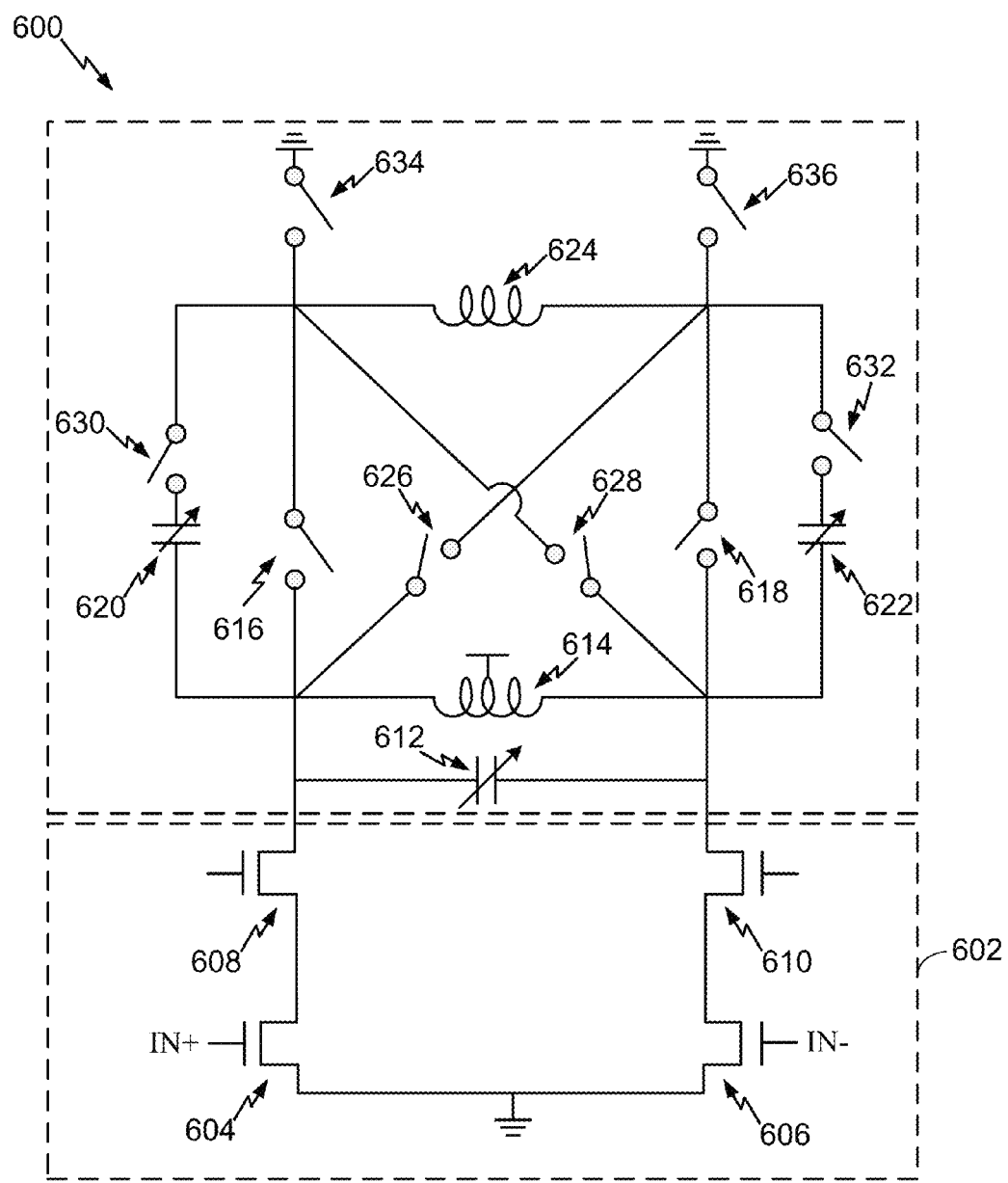
FIG. 6 is a diagram the depicts another exemplary embodiment of a multi-band driver amplifier having a differential amplifier including a single transistor core.

Referring to FIG. 6, another exemplary embodiment of a multi-band driver amplifier 600 having a differential amplifier 602 including a single transistor core is shown. In an exemplary embodiment, the driver amplifier 600 may correspond to, or be included in, one or more of the driver amplifiers 290pa, 290pk, 290sa, 290sl of FIG. 2. The driver amplifier 600 may receive control signals from control circuitry (e.g., the control circuitry 284) to selectively operate in a first frequency band, a second frequency band, or any combination thereof.

The driver amplifier 600 includes an inductor-capacitor (LC) tank 601 and a differential amplifier 602 (e.g., a transistor core). The differential amplifier 602 may include a transistor 604, a transistor 606, a transistor 608, and a transistor 610. In an exemplary embodiment, the transistors 604-610 of the differential amplifier 602 may be NMOS transistors. A source of the transistor 604 and a source of the transistor 606 may be coupled to ground. A gate of the transistor 604 and a gate of the transistor 606 may be coupled to receive a differential input signal (IN+, IN). To illustrate, the gate of the transistor 604 and the gate of the transistor 606 may be coupled to receive a transmission signal from the data processor/controller 280 of FIG. 2. A drain of the transistor 604 may be coupled to a source of the transistor 608, and a drain of the transistor 606 may be coupled to a source of the transistor 610.

A drain of the transistor 608 may be coupled to a first terminal of a tunable capacitor bank 612, and a drain of the transistor 610 may be coupled to a second terminal of the tunable capacitor bank 612. The tunable capacitor bank 612 may be coupled in parallel with an inductor 614. For example, the first terminal of the tunable capacitor bank 612 may be coupled to a first terminal of the inductor 614, and the second terminal of the tunable capacitor bank 612 may be coupled to a second terminal of the inductor 614.

Components of the LC tank 601 (e.g., CLC network components) may be selectively coupled to the output of the differential amplifier 602 such that the driver amplifier 600 may operate in multiple frequency bands. For example, the CLC network components include a capacitor 620, a capacitor 622, and an inductor 624. In an exemplary embodiment, the capacitor 620 and the capacitor 622 may be tunable capacitors (e.g., tunable capacitor banks). A first terminal of the capacitor 620 may be coupled to the first terminal of the inductor 614, and a second terminal of the capacitor 620 may be selectively coupled to a first terminal of the inductor 624 via a switch 630. A first terminal of the capacitor 622 may be coupled to the second terminal of the inductor 614, and a second terminal of the capacitor 622 may be selectively coupled to a second terminal of the inductor 624 via a switch 632. A switch 616 may be coupled in parallel with (e.g., across from) the capacitor 620, and a switch 618 may be coupled in parallel with (e.g., across from) the capacitor 622. The first terminal of the inductor 614 may be selectively coupled to the second terminal of the inductor 624 via a switch 626, and the second terminal of the inductor 614 may be selectively coupled to the first terminal of the inductor 624 via a switch 628.

The driver amplifier 600 may operate in a substantially similar manner as the driver amplifier 500 of FIG. 5. For example, during operation, the driver amplifier 600 may operate within a first frequency band (e.g., a 2 GHz frequency band), operate a second frequency band (e.g., a 5 GHz frequency band), or simultaneously operate in the first frequency band and the second frequency band.

The effective inductance of the driver amplifier 600 may be tuned (e.g., reduced or increased) using the switches 616, 618, 626, 628 to shift frequency ranges during operation. For example, control signals may open the switch 616, open the switch 618, close the switch 626, and close the switch 628 to reduce the effective inductance of the power amplifier 600. Alternatively, control signals may close the switch 616, close the switch 618, open the switch 626, and open the switch 628 to increase the effective inductance of the power amplifier 600.

The driver amplifier 600 of FIG. 6 may reduce die area and increase cost savings by utilizing a single differential amplifier 602 (as opposed to multiple transistor cores) to operate within one or more frequency bands. It will also be appreciated that the selectively activating the switches 616, 618, 626, 628 may extend the inductive tuning range of the driver amplifier 600 as compared to the inductor tuning range of the driver amplifier 500 of FIG. 5.

Figure 7:
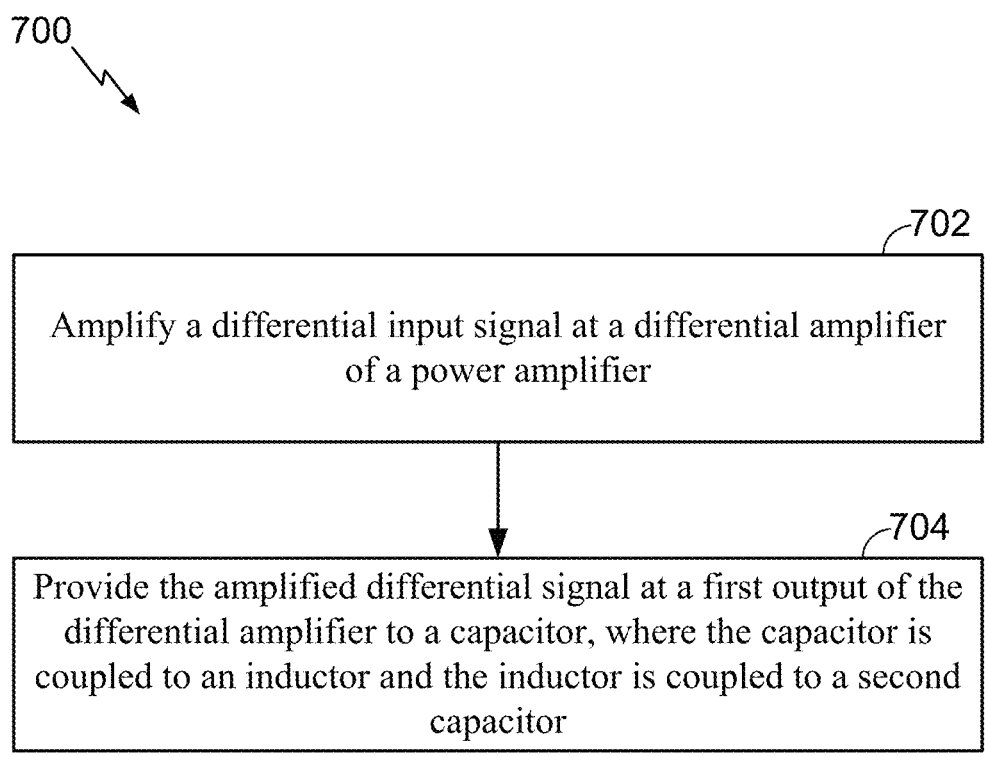
FIG. 7 is a flowchart that illustrates an exemplary embodiment of a method of operating a multi-band power amplifier.

Referring to FIG. 7, a flowchart that illustrates an exemplary embodiment of a method 800 of operating a multi-band power amplifier is shown. In an illustrative embodiment, the method 700 may be performed using the wireless device 110 of FIGS. 1-2, the power amplifier 300 of FIG. 3, the power amplifier 400 of FIG. 4, or any combination thereof.

The method 700 includes amplifying a differential input signal at a differential amplifier of a power amplifier, at 702. For example, referring to FIG. 3, the differential amplifier 302 of the power amplifier 300 may amplify the differential input signal (IN+), (IN−).

A first output of the differential amplifier may provide an amplified signal to a capacitor coupled to the first output of the differential amplifier, at 704. The capacitor may be coupled to an inductor, and the inductor may be coupled to a second capacitor. For example, referring to FIG. 3, the amplified differential signal may be provided by the first output of the differential amplifier 302 to the capacitor 326. The capacitor 326 is coupled to the inductor 330, and the inductor 330 is coupled to the capacitor 336.

In an exemplary embodiment, the method 700 may include enabling a first transistor coupled to the inductor to operate the power amplifier in a first frequency band. For example, referring to FIG. 3, the transistor 334 may be enabled (e.g., activated) to operate the power amplifier 300 in the first frequency band (e.g., the 2.4 GHz frequency band). To illustrate, the inductor 330 may be coupled to ground via the transistor 334 when the first enable signal (First_EN) has a logical high voltage level. Coupling the inductor 330 to ground may enable the power amplifier 300 to transmit signals over the first frequency band.

In an exemplary embodiment, the method 700 may include enabling a second transistor coupled to the second capacitor to concurrently operate the power amplifier in a first frequency band and a second frequency band. For example, referring to FIG. 3, the transistor 340 may be enabled to concurrently operate the power amplifier 300 in the first frequency band and the second frequency band (e.g., the 5.6 GHz frequency band). To illustrate, the capacitor 336 may be coupled to ground via the transistor 340 when the second enable signal (Second_EN) has a logical high voltage level. Coupling the capacitor 336 to ground via the transistor 340 may enable the power amplifier 300 to concurrently transmit signals over the first frequency band and the second frequency band.

The method 700 of FIG. 7 may reduce die area and increase cost savings by utilizing a single differential amplifier 302 (as opposed to multiple transistor cores) to operate within one or more frequency bands. One capacitor-inductor-capacitor (CLC) network may be coupled to the primary coil (e.g., the inductor 322) of the output balun. For example, the CLC network (e.g., the capacitor 326, the inductor 330, and the capacitor 328) may be coupled to the inductor 322 and configured to operate within the first frequency band and decoupled from the inductor 322 to operate within the second frequency band.

In conjunction with the described embodiments, an apparatus includes first means for storing charge. For example, the first means for storing charge may include the capacitor 336 of FIG. 3, the capacitor 436 of FIG. 4, one or more other devices, circuits, or any combination thereof. The apparatus may also include first means for generating an inductance coupled to the first means for storing charge. For example, the first means for generating the inductance may include the inductor 330 of FIG. 3, the inductor 430 of FIG. 4, one or more other devices, circuits, or any combination thereof.

The apparatus may also include second means for storing charge coupled to the first means for generating the inductance and to a first output of a differential amplifier. For example, the second means for storing charge may include the capacitor 326 of FIG. 3, the capacitor 426 of FIG. 4, one or more other devices, circuits, or any combination thereof.

The apparatus may also include third means for storing charge coupled to the first means for generating the inductance. For example, the third means for storing charge may include the capacitor 338 of FIG. 3, the capacitor 438 of FIG. 4, one or more other devices, circuits, or any combination thereof. The apparatus may also include fourth means for storing charge coupled to the first means for generating the inductance and to a second output of the differential amplifier. For example, the fourth means for storing charge may include the capacitor 328 of FIG. 3, the capacitor 428 of FIG. 4, one or more other devices, circuits, or any combination thereof.

The apparatus may also include fifth means for storing charge coupled to the second means for storing charge. For example, the fifth means for storing charge may include the capacitor 444 of FIG. 4, one or more other devices, circuits, or any combination thereof. The apparatus may also include second means for generating an inductance coupled to the fifth means for storing charge. For example, the second means for generating the inductance may include the inductor 448 of FIG. 4, one or more other devices, circuits, or any combination thereof.

The apparatus may also include sixth means for storing charge coupled to the fourth means for storing charge and to the second means for generating the inductance. For example, the sixth means for storing charge may include the capacitor 446 of FIG. 4, one or more other devices, circuits, or any combination thereof. The apparatus may also include means for amplifying a transmission signal. For example, the means for amplifying the transmission signal may include the power amplifier 300 of FIG. 3, the power amplifier 400 of FIG. 4, one or more other devices, circuits, or any combination thereof.

The apparatus may also include means for generating the transmission signal configured to provide the transmission signal to the means for amplifying the transmission signal. For example, the means for generating the transmission signal may include the driver amplifier 500 of FIG. 5, the driver amplifier 600 of FIG. 6, one or more other devices, circuits, or any combination thereof.

The means for generating the transmission signal may include first means for switching coupled in parallel to seventh means for storing charge. For example, the first means for switching may include the switch 516 of FIG. 5, one or more other devices, circuits, or any combination thereof. The seventh means for storing charge may include the capacitor 520 of FIG. 5, one or more other devices, circuits, or any combination thereof. The means for generating the transmission signal may also include second means for switching coupled in parallel to eighth means for storing charge. For example, the second means for switching may include the switch 518 of FIG. 5, one or more other devices, circuits, or any combination thereof. The eighth means for storing charge may include the capacitor 522 of FIG. 5, one or more other devices, circuits, or any combination thereof. The means for generating the transmission signal may also include third means for switching coupled in parallel to third means for generating an inductance. For example, the third means for switching may include the switch 526 of FIG. 5, one or more other devices, circuits, or any combination thereof. The third means for generating the inductance may include the inductor 524 of FIG. 5, the inductor 624 of FIG. 6, one or more other devices, circuits, or any combination thereof.

The means for generating the transmission signal may also include fourth means for switching configured to selectively coupled a first terminal of a fourth means for generating an inductance to a second terminal of the third means for generating the inductance. For example, the fourth means for switching may include the switch 626 of FIG. 6, one or more other devices, circuits, or any combination thereof. The fourth means for generating the inductance may include the inductor 624 of FIG. 6, one or more other devices, circuits, or any combination thereof.

The means for generating the transmission signal may also include fifth means for switching configured to selectively couple a second terminal of the fourth means for generating the inductance to a first terminal of the third means for generating the inductance. For example, the fifth means for switching may include the switch 628 of FIG. 6, one or more other devices, circuits, or any combination thereof.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a differential amplifier having a first output and a second output;
   a first capacitor having a first terminal coupled to the first output of the differential amplifier;
   an inductor having a first terminal coupled to a second terminal the first capacitor; and
   a second capacitor having a first terminal coupled to a second terminal of the inductor and a second terminal coupled to the second output of the differential amplifier, wherein the second terminal of the first capacitor is coupled to a first transistor and the first terminal of the second capacitor is coupled to a second transistor.

2. The apparatus of claim 1, further comprising a power amplifier that is tunable in broadband, wherein the power amplifier includes the first capacitor, the inductor, and the second capacitor.

3. The apparatus of claim 2, further comprising a driver amplifier configured to provide a transmission signal to the power amplifier, the driver amplifier comprising:
a first switch coupled in parallel to a seventh capacitor;
a second switch coupled in parallel to an eighth capacitor; and
a third switch coupled in parallel to a third inductor, wherein the first switch, the second switch, and the third switch are selectively activated to adjust an operating frequency of the driver amplifier.

4. The apparatus of claim 3, wherein the seventh capacitor and the eighth capacitor are tunable.

5. The apparatus of claim 1, further comprising a transformer having a first terminal coupled to the first output and to the first terminal of the first capacitor and having a second terminal coupled to the second output and to the second terminal of the second capacitor.

6. An apparatus comprising:
a differential amplifier having a first output and a second output;
a first capacitor having a first terminal coupled to the first output of the differential amplifier;
an inductor having a first terminal coupled to a second terminal the first capacitor;
a second capacitor having a first terminal coupled to a second terminal of the inductor and a second terminal coupled to the second output of the differential amplifier;
a third capacitor coupled to the first terminal of the inductor; and
a fourth capacitor coupled to the second terminal of the inductor and coupled, via the second capacitor, to the second output of the differential amplifier.

7. The apparatus of claim 6, wherein the third capacitor and the fourth capacitor are tunable capacitors.

8. The apparatus of claim 6, further comprising:
a fifth capacitor coupled to the second terminal of the second capacitor;
a second inductor coupled to a second terminal of the fifth capacitor; and
a sixth capacitor having a first terminal coupled to a second terminal of the second inductor and having a second terminal coupled to the first terminal of the first capacitor.

9. The apparatus of claim 6, further comprising:
a first transistor having a first terminal coupled to a ground voltage source and a second terminal coupled to the second terminal of the first capacitor and to the first terminal of the inductor;
a second transistor having a first terminal coupled to the ground voltage source and a second terminal coupled to the first terminal of the second capacitor and to the second terminal of the inductor;
a third transistor having a first terminal coupled to the ground voltage source and a second terminal coupled to a second terminal of the third capacitor; and
a fourth transistor having a first terminal coupled to the ground voltage source and a second terminal coupled to a first terminal of the fourth capacitor.

10. An apparatus comprising:
means for amplifying a differential signal; and
an impedance loop having a first end coupled to a first output of the means for amplifying and having a second end coupled to a second output of the means for amplifying, the impedance loop comprising:
first means for storing charge having a first terminal coupled to the first output of the means for amplifying;
means for generating an inductance having a first terminal coupled to a second terminal of the first means for storing charge; and
second means for storing charge having a first terminal coupled to a second terminal of the means for generating the inductance and a second terminal coupled to the second output of the means for amplifying, wherein the second terminal of the means for storing charge is coupled to first means for selectively conducting current and the first terminal of the second means for storing charge is coupled to second means for selectively conducting current.

11. The apparatus of claim 10, wherein the first means for storing charge, the means for generating the inductance, and the second means for storing charged are coupled in series in the impedance loop.

12. The apparatus of claim 10, further comprising:
third means for storing charge coupled to the first terminal of the means for generating the inductance; and
fourth means for storing charge coupled to the second terminal of the means for generating the inductance and coupled, via the second means for storing charge, to the second output of the means for amplifying.

13. The apparatus of claim 12, wherein the fourth means for storing charge and the third means for storing charge are tunable.

14. The apparatus of claim 12, further comprising:
a second impedance loop having a first end coupled to the first output of the means for amplifying and having a second end coupled to the second output of the means for amplifying, the second impedance loop comprising:
fifth means for storing charge;
second means for generating an inductance coupled to the fifth means for storing charge; and
sixth means for storing charge coupled to the second means for generating the inductance.

15. The apparatus of claim 10, further comprising means for generating the differential signal configured to provide the differential signal to the means for amplifying the differential signal, the means for generating the differential signal comprising:
first means for switching coupled in parallel to seventh means for storing charge;
second means for switching coupled in parallel to eighth means for storing charge; and
third means for switching coupled to third means for generating an inductance, wherein the first means for switching, the second means for switching, and the third means for switching are selectively activated to adjust an operating frequency of the means for generating the differential signal.

16. A method comprising:
amplifying a differential input signal at a differential amplifier of a power amplifier;
providing the amplified differential signal at a first output of the differential amplifier to a loop including a capacitor, an inductor coupled to the capacitor, and a second capacitor coupled to the inductor and to a second output of the differential amplifier;

receiving an enable signal; and based on the enable signal, providing a ground voltage to the capacitor the inductor and the second capacitor.

17. The method of claim 16, further comprising receiving the differential input signal from a multi-band driver amplifier.

18. The method of claim 16, further comprising:

receiving a second enable signal; and based on the second enable signal, providing a ground voltage to a third capacitor, a second inductor and a fourth capacitor of a second loop coupled to the differential amplifier.

\* \* \* \* \*